(12) United States Patent
Chao

(10) Patent No.: US 7,667,396 B2
(45) Date of Patent: Feb. 23, 2010

(54) ENCAPSULATION STRUCTURE OF DOUBLE SIDED ORGANIC LIGHT EMITTING DEVICE AND METHOD OF FABRICATING THE SAME

(75) Inventor: Ching-Ian Chao, Jhudong Township, Hsinchu County (TW)

(73) Assignee: Au Optronics Corp., Hsin-Chu (TW)

( * ) Notice: Subject to any disclaimer, the term of this patent is extended or adjusted under 35 U.S.C. 154(b) by 503 days.

(21) Appl. No.: 11/397,801

(22) Filed: Apr. 5, 2006

(65) Prior Publication Data

US 2007/0126354 A1 Jun. 7, 2007

(30) Foreign Application Priority Data

Dec. 2, 2005 (TW) .............................. 94142672 A

(51) Int. Cl.
*H01J 1/62* (2006.01)
(52) U.S. Cl. .................... 313/512; 445/24; 313/498
(58) Field of Classification Search ......... 313/498–512; 315/169.1, 169.3; 428/690–691, 917; 438/26–29, 438/34, 82; 257/40, 72, 98–100, 642–643, 257/759; 427/58, 64, 66, 532–535, 539; 445/24–25

See application file for complete search history.

(56) References Cited

U.S. PATENT DOCUMENTS

| | | | |
|---|---|---|---|
| 6,392,356 B1 * | 5/2002 | Stevens | 315/169.3 |
| 6,554,672 B2 * | 4/2003 | Dunham et al. | 445/25 |
| 6,803,127 B2 | 10/2004 | Su et al. | |
| 6,870,197 B2 | 3/2005 | Park et al. | |
| 6,909,110 B2 | 6/2005 | Park et al. | |
| 2004/0212300 A1 | 10/2004 | Chao et al. | |
| 2005/0057149 A1 * | 3/2005 | Herranen et al. | 313/504 |
| 2005/0104516 A1 * | 5/2005 | Park et al. | 313/512 |

FOREIGN PATENT DOCUMENTS

| | | | |
|---|---|---|---|
| CN | 1589071 A | | 3/2005 |
| CN | 1658711 A | | 8/2005 |
| JP | 2005084642 A | * | 3/2005 |
| TW | 586096 | | 4/2003 |
| TW | 586096 | | 5/2004 |
| TW | 588562 | | 5/2004 |
| TW | 595260 | | 6/2004 |

* cited by examiner

*Primary Examiner*—Peter J Macchiarolo
*Assistant Examiner*—Donald L Raleigh
(74) *Attorney, Agent, or Firm*—Rabin & Berdo, PC

(57) ABSTRACT

An encapsulation structure of double sided organic light emitting device (OLED) comprises a first substrate and a second substrate disposed oppositely; a first organic light emitting device (OLED) disposed on the first substrate; a second OLED disposed on the second substrate; a supporter disposed between the first OLED and the second OLED; and at least a moisture absorption layer disposed at the supporter for absorbing moisture inside the encapsulation structure.

21 Claims, 3 Drawing Sheets

ENCAPSULATION STRUCTURE OF DOUBLE SIDED ORGANIC LIGHT EMITTING DEVICE AND METHOD OF FABRICATING THE SAME

This application claims the benefit of Taiwan application Ser. No. 094142672, filed Dec. 2, 2005, the subject matter of which is incorporated herein by reference.

BACKGROUND OF THE INVENTION

1. Field of the Invention

The invention relates in general to an encapsulation structure of double sided organic light emitting device (OLED) and method of fabricating the same, and more particularly to a compact encapsulation structure of OLED being resistant to moisture and present a compact appearance.

2. Description of the Related Art

Use of organic light emitting device (OLED) in the flat panel displays possesses several competitive advantages, such as self illumination, high brightness, wide viewing angle, vivid contrast, quick response, broad range of operating temperature, high luminous efficiency and uncomplicated process of fabrication. Thus, the OLED represents a promising technology for display applications and has receives the worldwide attention in the recent years.

The typical structure of OLED is mainly constructed by interposing an organic light emitting layer between an anode and a cathode. A hole injection layer (HIL) and a hole transport layer (HTL) are interposed between the anode and the organic light emitting layer. An electron transport layer (ETL) is interposed between the cathode and the organic light emitting layer. This laminated structure of OLED facilitates the electron flow from the cathode to the anode. The organic light emitting layer can be divided into tow groups according to the materials in use. One group is a molecule-based light emitting diode, substantially comprising the dyestuffs or pigments. The other group is a polymer-based light emitting diode, also known as "LEP" (i.e. light emitting polymer). Whether the organic light emitting layer is molecule-based or polymer-based, the moisture shock has the considerable effect on the image quality displayed by the device. Those common effects includes the short operation life, low emission efficiency of the organic light emitting layer caused by the material degradation, and the "dark spot" (i.e. the spot of the light emitting portion unable to emit the light which results from a lack of current flow at the spot) caused by the adhesion failure between the organic light emitting layer and the cathode. Therefore, it is necessary to protect the OLED from the moisture intrusion.

Additionally, it is a trend to make a displaying apparatus, for example, cellular phone, personal digital assistance (PDA), digital camera and laptop, with doubled sided OLED for showing more information on the displaying apparatus simultaneously. The doubled sided OLEDs can be divided into three types according to the structural differences. The first type uses one OLED with two transparent electrodes to display two opposite images. In the second type, a bottom-emission OLED and a top-emission OLED are formed at the same substrate for displaying two independent images, which is low production cost but small aperture ratio of pixels of the displaying apparatus. Also, the technique of the second type OLED is immature and not suitable for fabrication on the mass production scale so far. In the third type, two bottom-emission OLEDs are formed at the different substrates. After the substrates are well assembled, the two different images can be presented independently. It is easier to prepare the third type OLED on the mass production scale. However, for assembling and encapsulating the third type OLED, the techniques of solid thin film packaging and/or thin-film desiccant disposing may be required, which both are still developing and not ready for application on the mass production scale.

Generally, the thickness of the desiccant is about 100 μm at least. If the third type doubled sided OLED is assembled and encapsulated according to the design for assembling and encapsulating the conventional OLED (as shown in FIG. 1 and described later), the thicker sealing glue will be needed so that moisture is easy to enter and damage OLED (as showing in FIG. 2). In the following paragraphs, the methods for assembling and encapsulating the single sided OLED (i.e. the conventional type) and the double sided OLED (i.e. the third type) are further described.

FIG. 1 (related art) illustrates a conventional encapsulation structure of single sided organic light emitting device (OLED). As shown in FIG. 1, an organic light emitting device (OLED) 3, formed on a glass substrate 2, comprises an anode (made of indium tin oxide (ITO), indium zinc oxide (IZO) or cadmium tin oxide (CTO)), an organic light emitting layer and a cathode. Also, a cover such as a glass sealing case 4 is assembled with the substrate 2 by a sealing glue 6, thereby providing an internal space 5 between the glass sealing case 4 and the OLED 3. The sealing glue 6 is typically in a thickness of 10-20 μm. The dried inert gas is enclosed in the internal space 10. Also, a desiccant 7 is attached to the glass sealing case 4 for absorbing the moisture.

FIG. 2 (related art) illustrates a conventional encapsulation structure of double sided organic light emitting device (OLED). The encapsulation design of FIG. 2 is the third type of the structures mentioned before. For displaying two individual images, the first and second OLEDs 23, 24 are formed on the first and second substrates 21, 22, respectively. The desiccant (mainly composed of calcium oxide (CaO)) 27 is attached to either the first OLED 23 (as shown in FIG. 2) or the second OLED 24. Afterward, the first and second substrates 21, 22 are assembled by the sealing glue 26 to complete the encapsulation. However, this conventional encapsulation design may cause damage to the first OLED 23/the second OLED 24 during the assembly. Also, the thicker sealing glue 26 contacts the atmosphere with larger area, so as to increase the opportunity for moisture to get inside the encapsulation structure.

SUMMARY OF THE INVENTION

It is therefore an object of the present invention to provide an encapsulation structure of double sided organic light emitting device (OLED) and method of fabricating the same. By disposing a supporter, the encapsulation structure of OLED is able to be resistant to moisture and cause no damage to the OLED during assembly.

the present invention achieves the objects by providing an encapsulation structure of double sided organic light emitting device (OLED) comprises a first substrate and a second substrate disposed oppositely; a first organic light emitting device (OLED) disposed on the first substrate; a second OLED disposed on the second substrate; a supporter disposed between the first OLED and the second OLED; and at least a moisture absorption layer disposed at the supporter for absorbing moisture inside the encapsulation structure.

The present invention achieves the objects by providing a method of fabricating encapsulation structure of double sided organic light emitting device (OLED), comprising steps of:

providing a first substrate and a second substrate;

disposing a first organic light emitting device (OLED) on the first substrate;

disposing a second OLED on the second substrate;
providing a supporter with at least a moisture absorption layer disposed thereon; and
assembling the first substrate and the second substrate wherein the first OLED and the second OLED are disposed oppositely, and the supporter is positioned between the first OLED and the second OLED.

Other objects, features, and advantages of the present invention will become apparent from the following detailed description of the preferred but non-limiting embodiments. The following description is made with reference to the accompanying drawings.

DETAILED DESCRIPTION OF THE INVENTION

In the present invention, an encapsulation structure of double sided organic light emitting device (OLED) and a method of fabricating the same are disclosed. The encapsulation structure not only prevents the damage from moisture, but also can be fabricated by adopting a mature packaging technique. There are three embodiments are provided. It is noted that the embodiments disclosed herein are used for illustrating the present invention, but not for limiting the scope of the present invention. Additionally, the drawings used for illustrating the embodiments and applications of the present invention only show the major characteristic parts in order to avoid obscuring the present invention. Accordingly, the specification and the drawings are to be regard as an illustrative sense rather than a restrictive sense.

First Embodiment

Figure 1:
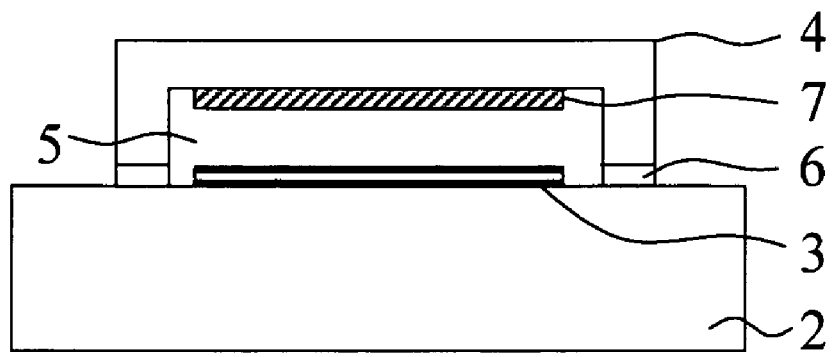
FIG. 1 (related art) illustrates a conventional encapsulation structure of single sided organic light emitting device (OLED).
Figure 2:
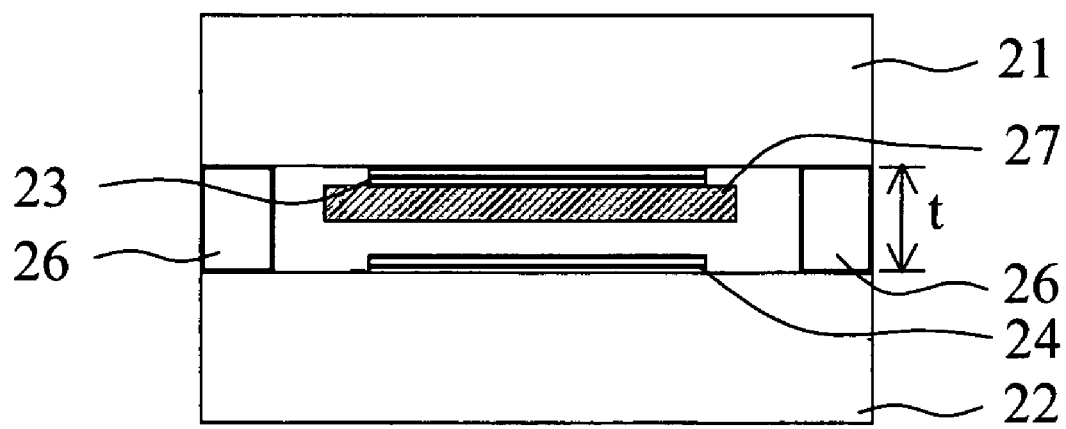
FIG. 2 (related art) illustrates a conventional encapsulation structure of double sided organic light emitting device (OLED).
Figure 3A:
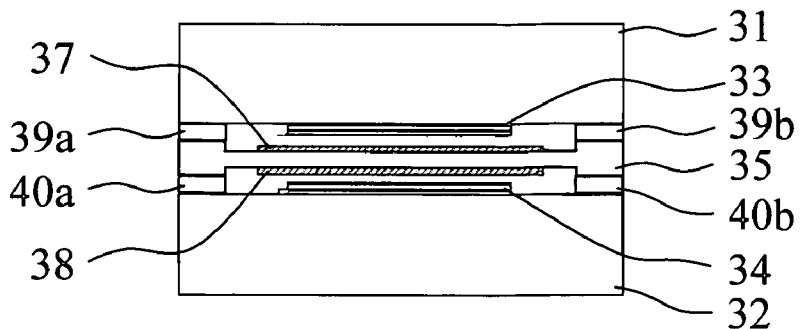
FIG. 3A illustrates an encapsulation structure of double sided organic light emitting device (OLED) according to the first embodiment of the present invention.

FIG. 3A illustrates an encapsulation structure of double sided organic light emitting device (OLED) according to the first embodiment of the present invention. In the first embodiment, the encapsulation structure comprises a first substrate 31, a second substrate 32, a first OLED 33, a second OLED 34, a supporter 35, a first moisture absorption layer 37 and a second moisture absorption layer 38. The first substrate 31 and the second substrate 32 are disposed oppositely. The first OLED 33 is disposed on the first substrate 31. The second OLED 34 is disposed on the second substrate 32, and opposite to the first OLED 33. The supporter 35 is disposed between the first OLED 33 and the second OLED 34.

Figure 3B:
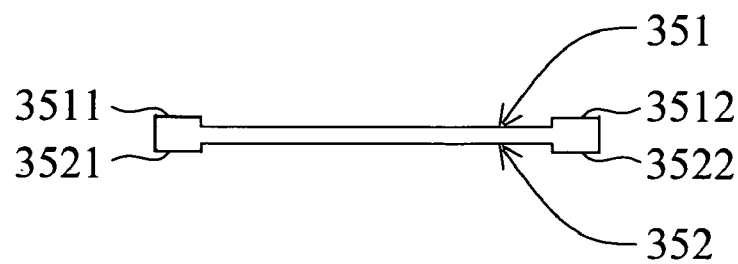
FIG. 3B illustrates the supporter according to the first embodiment of the present invention.

FIG. 3B illustrates the supporter according to the first embodiment of the present invention. The supporter 35 has a first surface 351 and a second surface 352. The first moisture absorption layer 37 and the second moisture absorption layer 38 are disposed on the first surface 351 and the second surface 352, respectively. The disposition of the first moisture absorption layer 37 and the second moisture absorption layer 38 can be done by many different ways, such as adhesively attaching, vacuum depositing, or coating/curing the moisture absorption films. There is not particular limitation herein. The supporter 35 with the first moisture absorption layer 37 and the second moisture absorption layer 38 compose a supporting unit, capable of absorbing the moisture inside the encapsulation structure.

Additionally, the supporter 35 can be made of metal, alloy, glass, quartz, and the like. The supporter 35 is the same width of the first substrate 31 and the second substrate 32 according to the first embodiment. However, it is understood that the size of the supporter 35 can be varied according to the practical bonding requirement.

When the assembly is proceeding, the first substrate 31 with the first OLED 33 is disposed opposite to the second substrate 32 with the second OLED 34, and the supporting unit is disposed between the first OLED 33 and the second OLED 34. Meanwhile, the first moisture absorption layer 37 and the second moisture absorption layer 38 on the supporter 35 face the first OLED 33 and the second OLED 34, respectively. Next, the first sealing glues 39a, 39b and the second sealing glues 40a, 40b are provided for assembling the first substrate 31 and the second substrate 32. As shown in FIG. 3A, two edges of the first surface 351 (i.e. the first edge 3511 and the second edge 3512 of FIG. 3B) of the supporter 35 are attached to the first substrate 31 by the first sealing glues 39a and 39b. Two edges of the second surface 352 (i.e. the first edge 3521 and the second edge 3522 of FIG. 3B) of the supporter 35 are attached to the second substrate 32 by the second sealing glues 40a and 40b.

According to the first embodiment, it is noted that the first moisture absorption layer 37 and the second moisture absorption layer 38 on the supporter 35 are separated from the first OLED 33 and the second OLED 34 after assembly is completed. Thus, the convention problem that OLED damage caused by the direct attaching between the moisture absorption layer and the OLED can be solved. Meanwhile, thinner thickness of glue would reduce the moisture permeability.

Second Embodiment

Figure 4A:
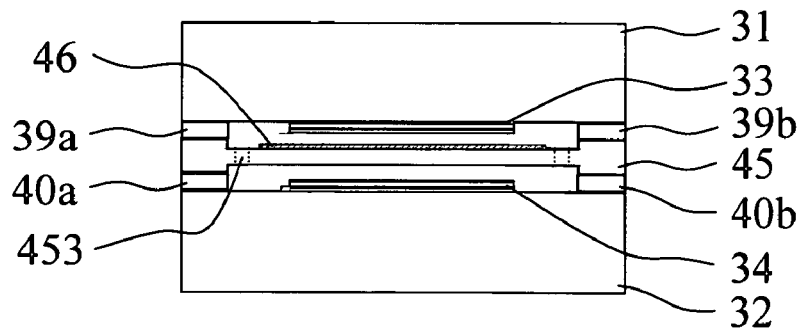
FIG. 4A illustrates an encapsulation structure of double sided organic light emitting device (OLED) according to the second embodiment of the present invention.
Figure 4B:
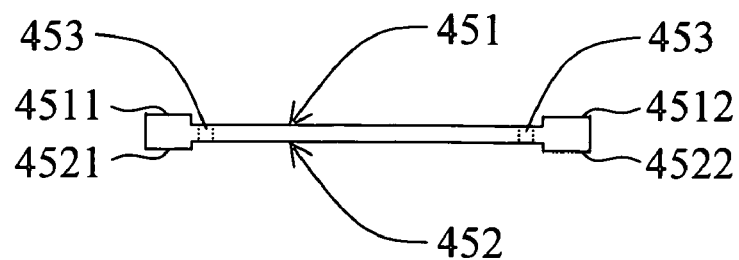
FIG. 4B illustrates the supporter according to the second embodiment of the present invention.

FIG. 4A illustrates an encapsulation structure of double sided organic light emitting device (OLED) according to the second embodiment of the present invention. Components common to FIG. 3A retain the same numeric designation. FIG. 4B illustrates the supporter according to the second embodiment of the present invention.

In the second embodiment, the encapsulation structure comprises a first substrate 31, a second substrate 32, a first OLED 33, a second OLED 34, a supporter 45 and a moisture absorption layer 46. The first substrate 31 and the second substrate 32 are disposed oppositely. The first OLED 33 is disposed on the first substrate 31. The second OLED 34 is disposed on the second substrate 32, and opposite to the first OLED 33. The supporter 45 is disposed between the first OLED 33 and the second OLED 34.

The supporter 45, having a first surface 451 and a second surface 452, comprises at least a through hole penetrated from the first surface 451 to the second surface 452. The moisture absorption layer 46 is disposed either on the first surface 451 or the second surface 452. In the second embodiment, two through holes 453 formed on the supporter 45 (as shown in FIG. 4B) and the moisture absorption layer 46 disposed at the first surface 451 are taken for illustration. The disposition of the moisture absorption layer 46 can be done by many different ways, such as adhesively attaching, vacuum depositing, or coating/curing the moisture absorption films. There is not particular limitation herein. Since the through holes 453 penetrates the supporter 45, the moisture absorption layer 46 is capable of absorbing the moisture inside the encapsulation structure whether it is close to the first OLED 33 or the second OLED 34.

Similarly, the supporter 45 can be made of metal, alloy, glass, quartz, and the like. The supporter 45 is about the same width of the first substrate 31 and the second substrate 32 according to the second embodiment. However, it is understood that the size of the supporter 45 can be varied according to the practical bonding requirement.

The assembling methods of the first embodiment and the second embodiment are very similar. First, the first substrate 31 with the first OLED 33 sets opposite to the second substrate 32 with the second OLED 34, and the supporter 45 with the moisture absorption layer 46 is disposed between the first OLED 33 and the second OLED 34. Then, the first sealing glues 39a, 39b and the second sealing glues 40a, 40b are provided for assembling the first substrate 31 and the second substrate 32. As shown in FIG. 4A, two edges of the first surface 451 (i.e. the first edge 4511 and the second edge 4512 of FIG. 4B) of the supporter 45 are attached to the first substrate 31 by the first sealing glues 39a and 39b. Two edges of the second surface 452 (i.e. the first edge 4521 and the second edge 4522 of FIG. 4B) of the supporter 45 are attached to the second substrate 32 by the second sealing glues 40a and 40b. After assembly is completed, the moisture getting inside the encapsulation structure can be absorbed by the moisture absorption layer 46 because of the through holes 453 penetrating the supporter 45. According to the second embodiment, the moisture absorption layer is separated from the first OLED 33 after assembly is completed. Thus, the convention problem that OLED damage caused by the direct attaching between the moisture absorption layer and the OLED can be solved.

Third Embodiment

Figure 5:
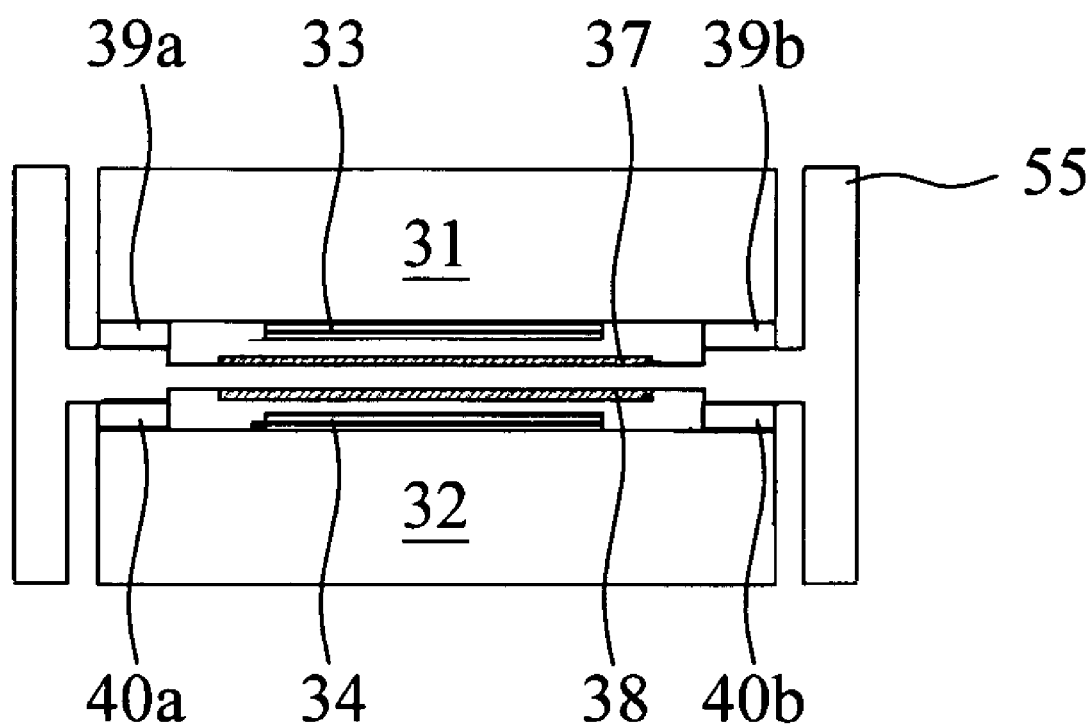
FIG. 5 illustrates an encapsulation structure of double sided organic light emitting device (OLED) according to the third embodiment of the present invention.

FIG. 5 illustrates an encapsulation structure of double sided organic light emitting device (OLED) according to the third embodiment of the present invention. Components common to FIG. 3A retain the same numeric designation.

The major difference between the third and first embodiments is that the supporter 55 is wider than the first substrate 31 and the second substrate 32. Also, the exterior side of the supporter 55 is not thicker than (ex. about the same thickness with) the overall structure after the encapsulation is completed. Accordingly, the supporter design of the third embodiment not only prevents the direct touch between the OLED and the moisture absorption layer, but also increases the strengths of the encapsulation structure.

According to the encapsulation structures disclosed in the first, second and third embodiments, the first sealing glues 39a, 39b and the second sealing glues 40a, 40b each can be controlled in a thickness of about (even less than) 10 μm. Thus, the total thickness of sealing glues (such as the first sealing glue 39a plus the second sealing glue 40a) is less than 25 μm. In the conventional encapsulation design, the sealing glue is in a thickness of more than 100 μm if a conventional desiccant (moisture absorption layer) is adopted. Therefore, the encapsulation structure of the present invention not only prevents the direct touch between the OLED and the moisture absorption layer, but also reduces the contact area between the sealing glues (i.e. 39a, 39b, 40a, 40b) and the atmosphere so as to decrease the amount of water getting into the encapsulation structure. Besides, to meet the requirement of light weight and compact size for the displaying apparatus, the overall dimension of the encapsulation structure can be reduced to a minimum value, depending on the practical application.

While the invention has been described by way of examples and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An encapsulation structure of double sided organic light emitting device (OLED), comprising:
   a first substrate and a second substrate disposed oppositely;
   a first organic light emitting device (OLED), disposed on the first substrate;
   a second OLED, disposed on the second substrate;
   a supporter, disposed between the first OLED and the second OLED, the supporter having a first surface and a second surface opposite to the first OLED and the second OLED, respectively, wherein the supporter has at least one through hole penetrating from the first surface to the second surface; and
   at least one moisture absorption layer, disposed either on the first surface or the second surface of the supporter for absorbing moisture inside the encapsulation structure;
   wherein a thickness of an exterior side of the supporter is the same as an overall thickness of the encapsulation structure.

2. The encapsulation structure according to claim 1, wherein the supporter comprises a plurality of through holes.

3. The encapsulation structure according to claim 1, wherein the at least one moisture absorption layer comprises a first moisture absorption layer and a second moisture absorption layer disposed at the first surface and the second surface, and separated from the first OLED and the second OLED, respectively.

4. The encapsulation structure according to claim 1, wherein the edges of the first surface of the supporter are attached to the first substrate by a first sealing glue, while the edges of the second surface are attached to the second substrate by a second sealing glue.

5. The encapsulation structure according to claim 4, wherein each of the first sealing glue and the second sealing glue is about 5 μm to 15 μm.

6. The encapsulation structure according to claim 4, wherein an overall thickness of the first sealing glue and the second sealing glue is less than about 30 μm.

7. The encapsulation structure according to claim 1, wherein a width of the supporter is equal to each width of the first substrate and the second substrate.

8. The encapsulation structure according to claim 1, wherein a width of the supporter is larger than each width of the first substrate and the second substrate.

9. The encapsulation structure according to claim 1, wherein the supporter is made of metal, alloy, glass, or quartz.

10. A method of fabricating encapsulation structure of double sided organic light emitting device (OLED), comprising:

providing a first substrate and a second substrate disposing a first organic light emitting device (OLED) on the first substrate;

disposing a second OLED on the second substrate;

providing a supporter having a first surface and a second surface, and at least one moisture absorption layer, disposed either on the first surface or the second surface of the supporter, the supporter having at least one through hole penetrating from the first surface to the second surface; and assembling the first substrate and the second substrate wherein the first OLED and the second OLED are disposed oppositely, and the supporter is disposed between the first OLED and the second OLED;

wherein a thickness of an exterior side of the supporter is the same as an overall thickness of the encapsulation structure after assembling the first substrate and the second substrate.

11. The method according to claim 10, wherein the first surface and the second surface are opposite to the first OLED and the second OLED, respectively.

12. The method according to claim 10, wherein the at least one moisture absorption layer comprises a first moisture absorption layer and a second moisture absorption layer are disposed at the first surface and the second surface, and separated from the first OLED and the second OLED, respectively.

13. The method according to claim 10, further comprising:

providing a first sealing glue and a second sealing glue, wherein the edges of the first surface of the supporter are attached to the first substrate by the first sealing glue, while the edges of the second surface are attached to the second substrate by the second sealing glue when the first substrate and the second substrate are assembled.

14. The method according to claim 10, wherein the moisture absorption layer is disposed on the supporter by attaching, vacuum depositing, or coating.

15. An encapsulation structure of double sided organic light emitting device (OLED), comprising:

a first substrate and a second substrate disposed oppositely;

a first organic light emitting device (OLED), disposed on the first substrate;

a second OLED, disposed on the second substrate; and a supporting unit, disposed between the first substrate and the second substrate, and separated from the first OLED and the second OLED, wherein a thickness of an exterior side of the supporting unit is the same as an overall thickness of the encapsulation structure.

16. The encapsulation structure of according to claim 15, wherein the supporting unit comprising:

a supporter, having a first surface and a second surface; and at least a moisture absorption layer, disposed either at the first surface or the second surface.

17. An encapsulation structure of double sided organic light emitting device (OLED), comprising:

a first substrate and a second substrate disposed oppositely;

a first organic light emitting device (OLED), disposed on the first substrate;

a second OLED, disposed on the second substrate;

a supporter, having a first surface and a second surface, wherein the first surface of the supporter are attached to the first substrate by a first sealing glue, while the second surface are attached to the second substrate by a second sealing glue, wherein a thickness of an exterior side of the supporter is the same as an overall thickness of the encapsulation structure.

18. The encapsulation structure of according to claim 16, wherein a width of the supporter is larger than each width of the first substrate and the second substrate.

19. The encapsulation structure of according to claim 18, wherein the supporter has at least a through hole penetrating from the first surface to the second surface.

20. The encapsulation structure of according to claim 17, wherein a width of the supporter is larger than each width of the first substrate and the second substrate.

21. The encapsulation structure of according to claim 20, wherein the supporter has at least a through hole penetrating from the first surface to the second surface.

* * * * *

UNITED STATES PATENT AND TRADEMARK OFFICE
CERTIFICATE OF CORRECTION

PATENT NO. : 7,667,396 B2  Page 1 of 1
APPLICATION NO. : 11/397801
DATED : February 23, 2010
INVENTOR(S) : Ching-Ian Chao It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 827 days.

Signed and Sealed this

Seventh Day of December, 2010

David J. Kappos
*Director of the United States Patent and Trademark Office*